United States Patent
Zhang (10) Patent No.: US 10,804,846 B2
(45) Date of Patent: Oct. 13, 2020

(54) COUPLED-INDUCTOR BASED RESONATOR AND FORMED VOLTAGE CONTROLLED OSCILLATOR THEREOF

(71) Applicant: Chengdu Sicore Semiconductor Corp. Ltd., Chengdu (CN)

(72) Inventor: Cemin Zhang, Chino, CA (US)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 0 days.

(21) Appl. No.: 16/365,586

(22) Filed: Mar. 26, 2019

(65) Prior Publication Data

US 2019/0372524 A1 Dec. 5, 2019

(30) Foreign Application Priority Data

Jun. 4, 2018 (CN) .......................... 2018 1 0564607

(51) Int. Cl.
*H03B 5/12* (2006.01)

(52) U.S. Cl.
CPC ......... *H03B 5/1243* (2013.01); *H03B 5/1218* (2013.01); *H03B 5/1231* (2013.01); *H03B 5/1293* (2013.01); *H03B 2200/009* (2013.01)

(58) Field of Classification Search
CPC .. H03B 5/1243; H03B 5/1293; H03B 5/1231; H03B 5/1218; H03B 5/1265; H03B 5/1268; H03B 5/1203; H03B 5/1262; H03B 2200/009; H03H 7/09
See application file for complete search history.

(56) References Cited

U.S. PATENT DOCUMENTS

| | | | |
|---|---|---|---|
| 7,154,349 B2 | 12/2006 | Cabanillas | |
| 8,957,738 B1* | 2/2015 | Koechlin | H03B 5/1293 331/117 R |
| 2007/0279139 A1 | 12/2007 | El Rai et al. | |
| 2008/0284534 A1 | 11/2008 | El Rai | |
| 2009/0096557 A1 | 4/2009 | Eo et al. | |
| 2011/0148535 A1* | 6/2011 | Lee | H03B 27/00 331/117 FE |
| 2015/0116037 A1* | 4/2015 | Kanemaru | H03F 1/565 330/282 |

* cited by examiner

*Primary Examiner* — Jeffrey M Shin
(74) *Attorney, Agent, or Firm* — North Weber and Baugh LLP; Michael North (57) ABSTRACT

Various embodiments of the invention relate to a Multi-Band Voltage Controlled Oscillator (VCO). The multi-band VCO features a coupled-inductor based resonator. The resonator comprises a primary path and a secondary path inductively coupled to the primary path. The primary path comprises multiple LC tuning stages coupled in series with each stage having an adjustable capacitor and a primary inductor inductively coupled to the secondary path. The secondary path comprises multiple secondary inductors inductively coupled to respective primary inductors in the primary path. Furthermore, the secondary path comprises a plurality of controllable switches which are controlled to switch ON or OFF simultaneously to engage/disengage the inductive coupling between the primary path and the secondary path. Incorporating multiple LC tuning stages lowers voltage swing across each tuning stages, thus minimizing phase noise caused by nonlinearity in the resonator.

19 Claims, 6 Drawing Sheets

COUPLED-INDUCTOR BASED RESONATOR AND FORMED VOLTAGE CONTROLLED OSCILLATOR THEREOF

CROSS-REFERENCE TO RELATED APPLICATIONS

This application claims foreign priority to Chinese Patent Application No. 201810564607.0, entitled "A COUPLED-INDUCTOR BASED RESONATOR AND A FORMED VOLTAGE CONTROLLED OSCILLATOR THEREOF", naming Cemin Zhang as inventor, and filed Jun. 4, 2018, the subject matter of which is hereby incorporated herein by reference.

BACKGROUND

A. Technical Field

The present invention relates generally to a voltage controlled oscillator, and more particularly to a multi-band voltage controlled oscillator.

B. Background of the Invention

A voltage-controlled oscillator (VCO) is an electronic oscillator with oscillation frequency controlled by an input voltage. The applied input voltage determines the instantaneous oscillation frequency. A VCO may be used for various applications, e.g. frequency modulation (FM), phase modulation (PM), a phase-locked loop, etc.

A VCO may comprise a resonator with an amplifier to prevent the amplitude from decaying and isolate the resonator from the output such that the load does not affect the resonator. The resonator may be an inductor-capacitor (LC) oscillator with its resonating frequency variable in response to a control voltage. A semiconductor diode (e.g. varactor) having a voltage-dependent capacitance can be used to change the frequency of an oscillator by varying a control voltage applied to the diode. Such devices are very convenient in manufacturing and thus widely used in various voltage-controlled oscillators.

In certain situations, a multi-band wireless device may employ multiple VCOs to support operation on multiple frequency bands. Each VCO may be designated for a specific frequency band. Using multiple VCOs for multiple frequency bands may bring many undesirable issues, such as increasing cost and complexity, negative impact on reliability and robustness, etc.

Accordingly, there is a need for a multi-band VCO for wide applicability.

SUMMARY OF THE INVENTION

Described herein is a multi-band VCO having a coupled-inductor based resonator.

In some embodiments, the multi-band VCO features a coupled-inductor based resonator. The resonator comprises a primary path and a secondary path inductively coupled to the primary path. The primary path comprises multiple LC tuning stages coupled in series with each stage having an adjustable capacitor (e.g. a varactor or a back-to-back varactor pair) and a primary inductor inductively coupled to the secondary path. The secondary path comprises multiple secondary inductors inductively coupled to respective primary inductors in the primary path. Furthermore, the secondary path comprises a plurality of controllable switches which are controlled to switch ON or OFF simultaneously to engage/disengage the inductive coupling between the primary path and the secondary path. The number of the switches may or may not be the same as the inductors in the secondary path. Through switching ON or OFF all the switches simultaneously in the secondary path, the equivalent inductance value of each LC tuning stage is varied to act as a switchable inductor. With multiple LC tuning stages in the primary path, the resonator therefore has distributed LC tuning capacity with enhanced frequency tuning range. The capacitor in each LC tuning stage may comprise a variable capacitor, which may be controlled together with the switchable inductor to form multiple tuning bands. The tuning bands may have overlaps such that the overall frequency tuning range of the VCO has no gap.

Incorporating multiple LC tuning stages minimizes voltage swing across each tuning stages, thus minimizing phase noise caused by nonlinearity in the resonator. The configuration of multiple switches coupled in series in the secondary path allows relatively large switch size for each switch to achieve small ON resistance (RON) for each stage during switch ON period and large overall OFF resistance (ROFF) during switch OFF period such that the primary path is less affected in the OFF period. Furthermore, multiple switches coupled in series reduces voltage swing across each switch in the secondary path, thus reducing phase noise caused by nonlinearity of those switches.

In some embodiments, the multi-band VCO may be configured as a push-push VCO to further reduce oscillator phase noise as compared to conventional VCO. The push-push VCO comprises a first oscillator and a second oscillator coupled in a push-push configuration to output a single-ended or a differential output signal to an amplifier. The abovementioned configurations for the multi-band VCO are also applicable to the first and second oscillators. The push-push configuration may be symmetric along a virtue ground or a true ground. The amplifier may be a single-ended buffer amplifier or a differential amplifier depending on the output signal. Alternatively, the multi-band VCO may output a differential output signal to a doubler for doubling the output signal frequency band.

One skilled in the art will recognize that multi-band VCO is applicable in various RF circuits. One skilled in the art will further recognize that embodiments disclosed in this invention document may be implemented with various permutations, enhancements, equivalents, combinations, and improvements, all of which should fall within the scope of the present invention.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

FIG. ("FIG.") 1 is a prior art variable frequency generating device, formed by combining a variable inductance applying device and a resonance circuit.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment" it is intended mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Various embodiments of the invention are related to multi-band VCOs having one or more coupled-inductor based resonators. The multi-band VCO may comprise various components, e.g. microcontroller, memory module, controllable semiconductor switches, diodes, inductors, transistors, etc. These components may be integrated or packaged on single or discrete substrates.

Figure 1:
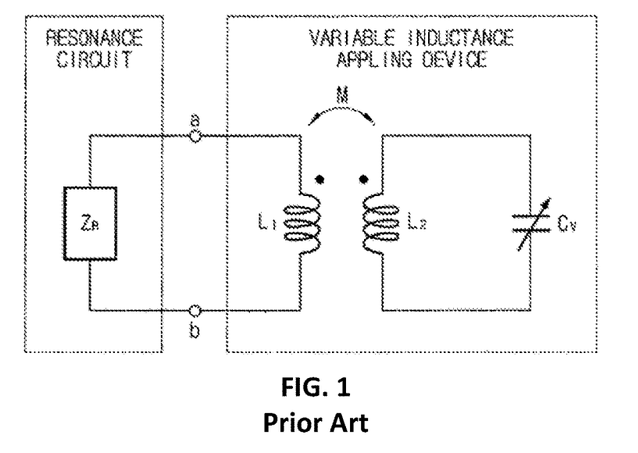

FIG. 1 is a prior art variable frequency generating device disclosed in U.S. Patent Application Publication No. 2009/0096557A1. The variable frequency generating device is formed by combining a variable inductance applying device and a resonance circuit. As shown in FIG. 1, there is no switch to control secondary loop formed by $L_2$ and $C_v$. The equivalent inductance $L_{eq}$ is controlled by $C_v$ only. Therefore, the resonance circuit has limited tuning means.

Figure 2:
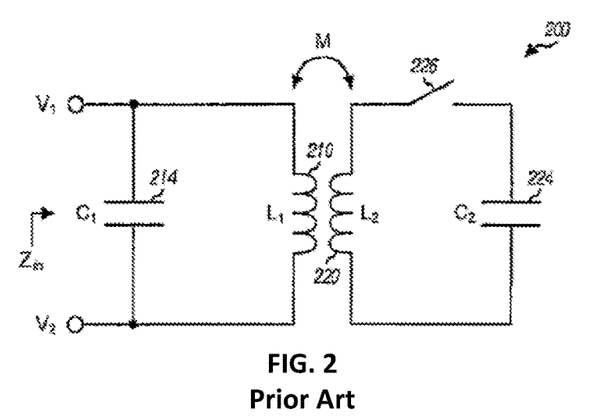
FIG. 2 is a prior art resonator with two coupled inductors.

FIG. 2 is a prior art resonator disclosed in U.S. Pat. No. 7,154,349. The resonator 200 has an inductor 210 coupled in parallel with a capacitor 214, an inductor 220 coupled in series with a capacitor 224, and a switch 226. Inductors 210 and 220 are magnetically coupled and may be viewed as the primary and secondary ports, respectively, of a 2-port transformer. Capacitors 214 and 224 may each be implemented with one or more fixed capacitors, one or more varactors, one or more switchable capacitors, or any combination thereof. Switch 226 may be selectively opened or closed to disable or enable, respectively, the secondary port, which then varies the electrical characteristics of resonator 200. Compared to the resonator in FIG. 1, the resonator 200 has an equivalent inductance adjustable by C1/C2 and/or switch 226, and therefore has more tuning means.

Figure 3:
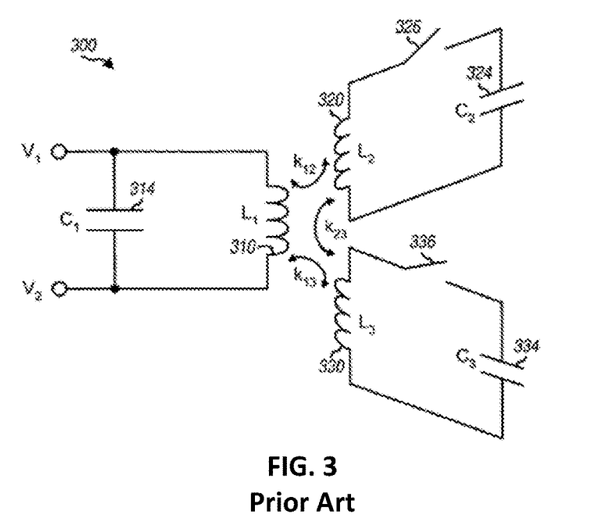
FIG. 3 is a prior art resonator with three coupled inductors.

FIG. 3 is another prior art resonator 300 with three coupled inductors, which was also disclosed in U.S. Pat. No. 7,154,349. Resonator 300 includes an inductor 310 coupled in parallel with a capacitor 314, an inductor 320 coupled in series with a capacitor 324, a switch 326, and an inductor 330 coupled in series with a capacitor 334 and a switch 336. Inductors 310, 320, and 330 are magnetically coupled and may be viewed as the primary, secondary, and tertiary ports, respectively, of a 3-port transformer. Capacitors 314, 324, and 334 may each be implemented with one or more fixed capacitors, one or more varactors, one or more switchable capacitors, or any combination thereof. Switches 326 and 336 may be individually opened or closed to selectively disable or enable the second and third ports, respectively, which would then vary the electrical characteristics of resonator 300. Similar to the resonator in FIG. 2, the resonator 300 has an equivalent inductance adjustable by secondary/tertiary capacitor and/or switch.

Both resonator 200 and resonator 300 have single stage tuning ($C_1$ in FIG. 2 and FIG. 3), and therefore have limited tuning range from primary tuning path. Furthermore, both resonator 200 and resonator 300 have single switching secondary LC path. To have good OFF effect (corresponding to large overall $R_{OFF}$), the switch size has to be small enough. On the other hand, to have good ON effect (corresponding to small $R_{ON}$), the switch size has to be large enough. Therefore, it would be challenging to balance these two contradictory requirements. Additionally, single inductor in secondary loop means large voltage swing across the switch of secondary path, which may cause nonlinearity and therefore bring undesired phase noise.

Embodiment 1

Figure 4:
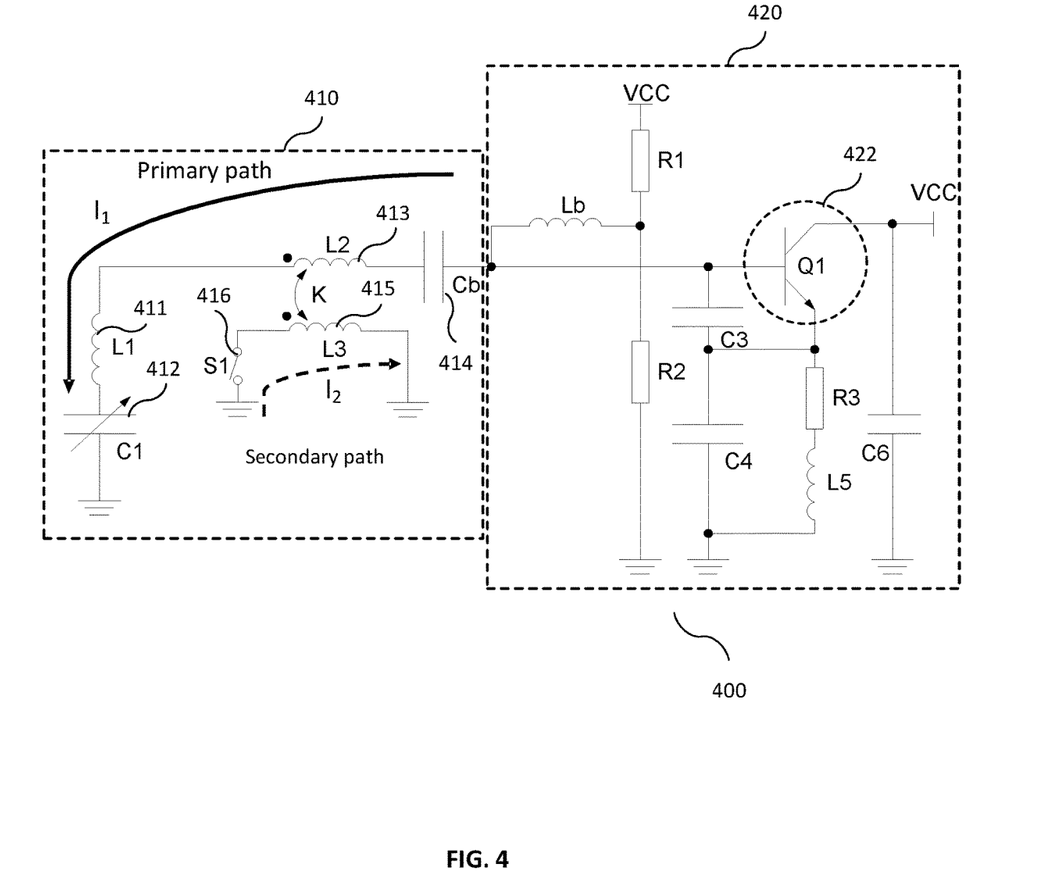
FIG. 4 is a circuit diagram of a VCO according to a first embodiment of the invention.

FIG. 4 is a circuit diagram of a multi-band VCO according to embodiment 1 of the invention. As shown in FIG. 4, the multi-band VCO 400 comprises a resonator 410 and a negative resistance circuit 420. The resonator 410 is a coupled-inductor based resonator comprising a primary path and a secondary path inductively coupled to the primary path. The resonator 410 incorporates a first LC tuning stage (comprising inductor $L_1$ 411 and capacitor $C_1$ 412), a coupled-inductor tuning stage (comprising inductor $L_2$ 413 and the secondary path) and a capacitor $C_b$ 414 for DC or low frequency isolation. The coupled-inductor tuning stage inductively couples to the secondary path. The secondary path comprises a controllable switch $S_1$ 416 and a secondary inductor $L_3$ 415 inductively coupled to inductor $L_2$ 413 in the primary path. The controllable switch $S_1$ 416 may be controlled to switch ON or OFF to engage/disengage the inductive coupling between inductor $L_2$ on the primary path and inductor $L_3$ on the secondary path. When $L_2$ and $L_3$ are engaged, current in the primary path $I_1$ generates a magnetic field that enters the secondary path and induces a current $I_2$, which creates a reverse magnetic field to the primary path and cancels part of the original magnetic flux. Therefore, the equivalent inductance $L_{eq}$ of inductor $L_2$ is reduced.

Such a switchable coupled-inductor based resonator may also be called a transformer-based resonator or a switchable coupled-inductor resonator, wherein the magnetically coupled inductors $L_2$ and $L_3$ may be viewed as a 2-port transformer. The mutual inductance M of inductors $L_2$ and $L_3$ may be given by:

$$M = k\sqrt{L_2 L_3} \qquad (1)$$

where k is the coupling factor (or coupling coefficient) between inductors $L_2$ and $L_3$. Switch S1 may be selectively opened or closed to disable or enable inductor $L_3$, which varies the electrical characteristics of the resonator 410.

Therefore, the equivalent inductance $L_{eq}$ of the inductors $L_2$ is expressed as:

$$L_{eq} \approx \begin{cases} L_2 & S1 \text{ is OFF} \\ L_2 - \dfrac{M^2}{L_2} & S1 \text{ is ON} \end{cases} \qquad (2)$$

Capacitors $C_1$ and $C_b$ may be a fixed capacitor, a variable capacitor, a switchable capacitor, or a combination thereof. Specifically, $C_1$ may be a semiconductor diode such as a varactor, with a voltage-dependent capacitance, which can be controlled or adjusted by varying a control voltage applied to the diode.

Due to the existence of internal resistance or other losses, oscillations in the resonator 410 may be damped and decay to zero. A negative resistance circuit 420 couples to the primary path of the resonator 410 to cancel the positive resistance of the resonator, thus creating in effect a lossless resonator to maintain continuous oscillations occur at the resonator's resonant frequency. The negative resistance circuit 420 includes a NPN transistor Q1 422, capacitors $C_3$ and $C_4$, resistor $R_3$ and inductor $L_5$. Capacitor $C_3$ couples between the base and the emitter of the NPN transistor Q1. The base of the NPN transistor Q1 coupled to the primary path of the resonator 410 (via the DC block capacitor Cb 414). The collector of the NPN transistor Q1 is connected to an external power supply $V_{CC}$. The emitter of the NPN transistor Q1 is grounded via resistor $R_3$ and inductor $L_5$. The resonator 410 connects to the base of the first NPN transistor $Q_1$. The base of the NPN transistor Q1 is DC biased by the external power supply $V_{CC}$ through voltage divider resistors R1, R2, and through a choke inductor Lb. In some embodiments, the negative resistance circuit 420 may be viewed as a voltage divider comprising the NPN transistor Q1, capacitor $C_3$, and capacitor $C_4$. The voltage across the capacitor $C_3$ provides a voltage feedback and inductor $L_5$ provides a negative feedback for the NPN transistor $Q_1$. Capacitors $C_3$ and $C_4$ may be a fixed capacitor, a variable capacitor, a switchable capacitor, or a combination thereof.

In some embodiments, the resonator 410 may incorporate one or more switchable coupled-inductors, and one or more LC tuning stages with each LC tuning stage comprising a variable capacitor. The variable capacitor in each LC tuning stage may be controlled together with the one or more switchable coupled inductors to form multiple tuning bands for the multi-band VCO 400. In some embodiments, the tuning bands may have overlaps such that the overall tuning range of the VCO has no gap.

Embodiment 2

Figure 5:
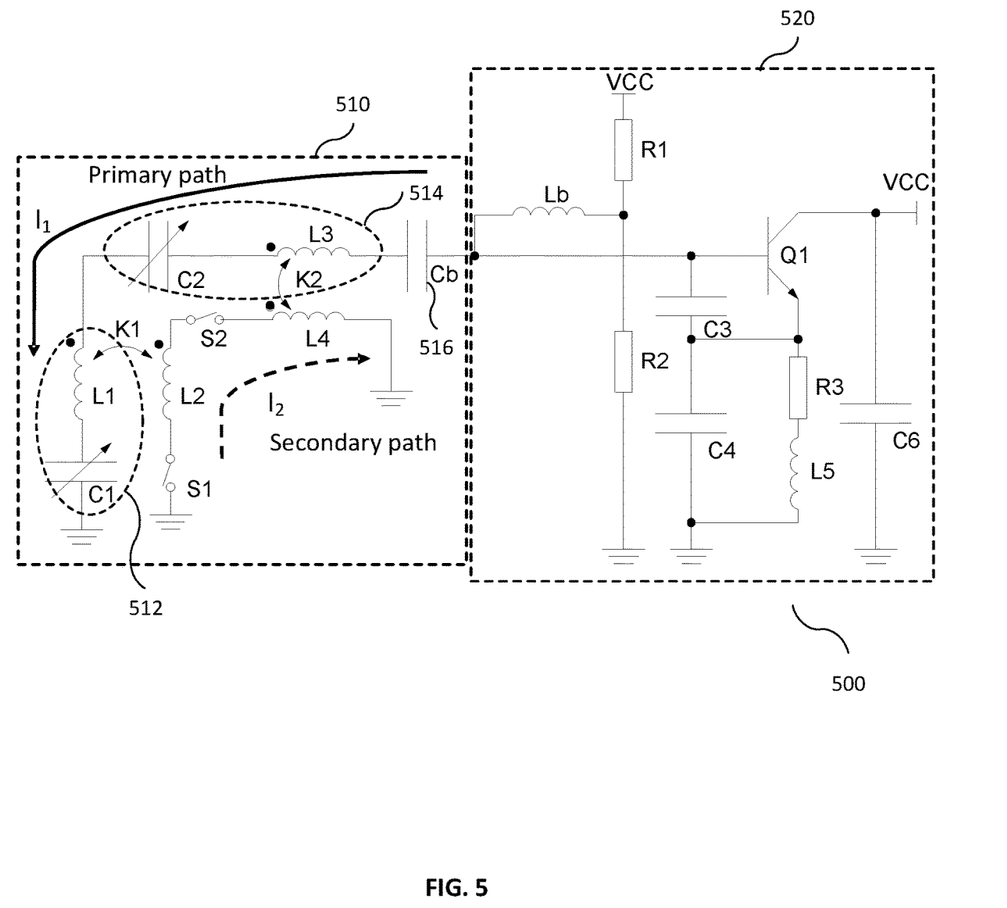
FIG. 5 is a circuit diagram of a VCO with multiple switches in secondary path according to a second embodiment of the invention.

FIG. 5 is a circuit diagram of a VCO 500 with multiple switches in secondary path according to embodiment 2 of the invention. Similar to the VCO 400 shown in FIG. 4, the VCO 500 also comprises a coupled-inductor based resonator 510 comprising a primary path and a secondary path inductively coupled to the primary path. Different from the primary path in resonator 410, the primary path in resonator 510 comprises multiple LC tuning stages coupled in series, e.g. a first LC tuning stage 512 comprising a first inductor L1 and a first capacitor C1, a second LC tuning stage 514 comprising a second inductor L3 and a second capacitor C2. The inductor of each LC tuning stage is inductively coupled to a respective secondary inductor in the secondary path. For example, the first inductor L1 inductively couples to a first secondary inductor L2 and the second inductor L3 inductively couples to a second secondary inductor L4. Capacitors C1 and C2 may be one or more fixed capacitor, one or more variable capacitor, one or more switchable capacitor, or a combination thereof.

Besides the two secondary inductors, the secondary path in FIG. 5 also comprises multiple switches, e.g. a first switch S1 and a second switch S2. These switches may be controlled to switch ON or OFF simultaneously to engage/disengage the inductive coupling between the primary path and the secondary path.

In some embodiments, the resonator 510 has distributed LC tuning capacity with each LC tuning stage comprising a variable capacitor for enhanced frequency tuning range. The resonator 510 may further incorporate one or more switchable coupled-inductors. The variable capacitor in each LC tuning stage may be controlled together with the one or more switchable inductors to form multiple tuning bands for the multi-band VCO. In some embodiments, the frequency bands for the multiple tuning stages may have overlaps such that the overall tuning range of the multi-band VCO has no gap. In some embodiments, the VCO may provide an output signal from various points on the primary path, e.g., a connection point between L1 and C2, a connection point between L1 and C1, or a connection point between L3 and C2, etc.

In some embodiments, the resonator 510 further comprises a DC block capacitor Cb 516 disposed on the primary path to block DC bias voltage leaking from the NPN transistors Q1 into resonator 510. The value of Cb 516 also determines the overall resonant frequency of the VCO 500. Capacitor Cb may be implemented with one or more fixed capacitors, one or more switchable capacitors, or any combination thereof.

The configuration of multiple switches coupled in series in the secondary path allows relatively large switch size for each switch to achieve small $R_{ON}$ for each stage during switch ON period and large overall $R_{OFF}$ during switch OFF period such that the primary path is less affected in the OFF period. Furthermore, multiple switches coupled in series reduces voltage swing across each switch in the secondary path, thus reducing phase noise caused by nonlinearity of those switches.

Embodiment 3

Figure 6:
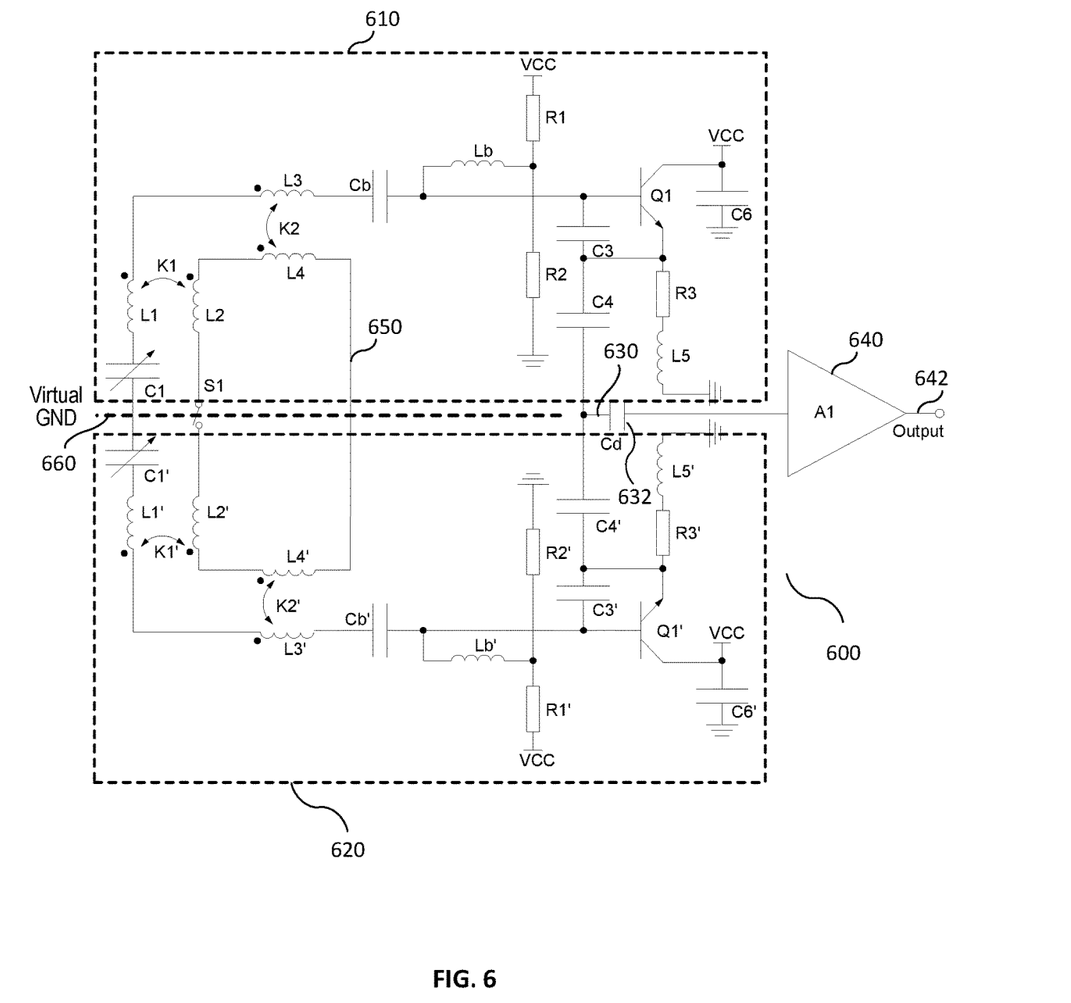
FIG. 6 is a multi-band push-push VCO according to a third embodiment of the invention.

In some embodiments, the multi-band VCO may be configured as a push-push VCO to further reduce oscillator phase noise as compared to conventional VCO. FIG. 6 is a multi-band push-push VCO 600 according to embodiment 3 of the invention. The push-push VCO 600 is formed by having two single-ended VCO 610 and 620 implemented in a balanced structure. The single-ended VCOs 610 and 620 couple in a balanced structure symmetrically along a symmetric line 660, which may be a virtual ground. The output signal from location 630 of the push-push VCO is fed to a single-ended buffer amplifier A1 640 via a capacitor Cd 632 to generate an amplified output signal 642. Due to the push-push VCO structure, output signal from location 630 (or from other points along virtual GND, e.g., connection point between C1 and C1') naturally cancel odd harmonics and amplify even harmonics, output location 630 is naturally a good location to tap output an output signal with doubled signal frequency of resonance frequency of the single-ended VCO 610/620. The capacitor Cd 632 may be used as DC blocking capacitor to block DC bias voltage leaking from the NPN transistors Q1 and Q1' into resonator.

The features of the VCO 400 and/or 500 may also be applicable to the single-ended VCO 610 and 620. For example, the VCO 610 and 620 may each incorporate a coupled-inductor based resonator comprising a primary path and a secondary path. The primary path comprising multiple LC tuning stages inductively coupled to a respective secondary inductor in the secondary path. The secondary path may also comprise multiple switches, which may be controlled to switch ON or OFF simultaneously to engage/disengage the inductive coupling between the primary path and the secondary path. Capacitors C1/C1', C3/C3' and C4/C4' may each be implemented with one or more fixed capacitors, one or more varactors, one or more switchable capacitors, or any combination thereof.

In some embodiments, the secondary paths of the each single-ended VCO couples to form a closed loop 650. The closed loop comprise at least one controllable switch S1. The equivalent inductor of the corresponding primary inductor (L1, L1', L3 and L3' in FIG. 6) of the primary path of each single-ended VCO is adjustable by switchably engaging the inductive coupling between the corresponding primary inductors and the corresponding secondary inductors (L2, L2', L4 and L4' in FIG. 6).

Embodiment 4

Figure 7:
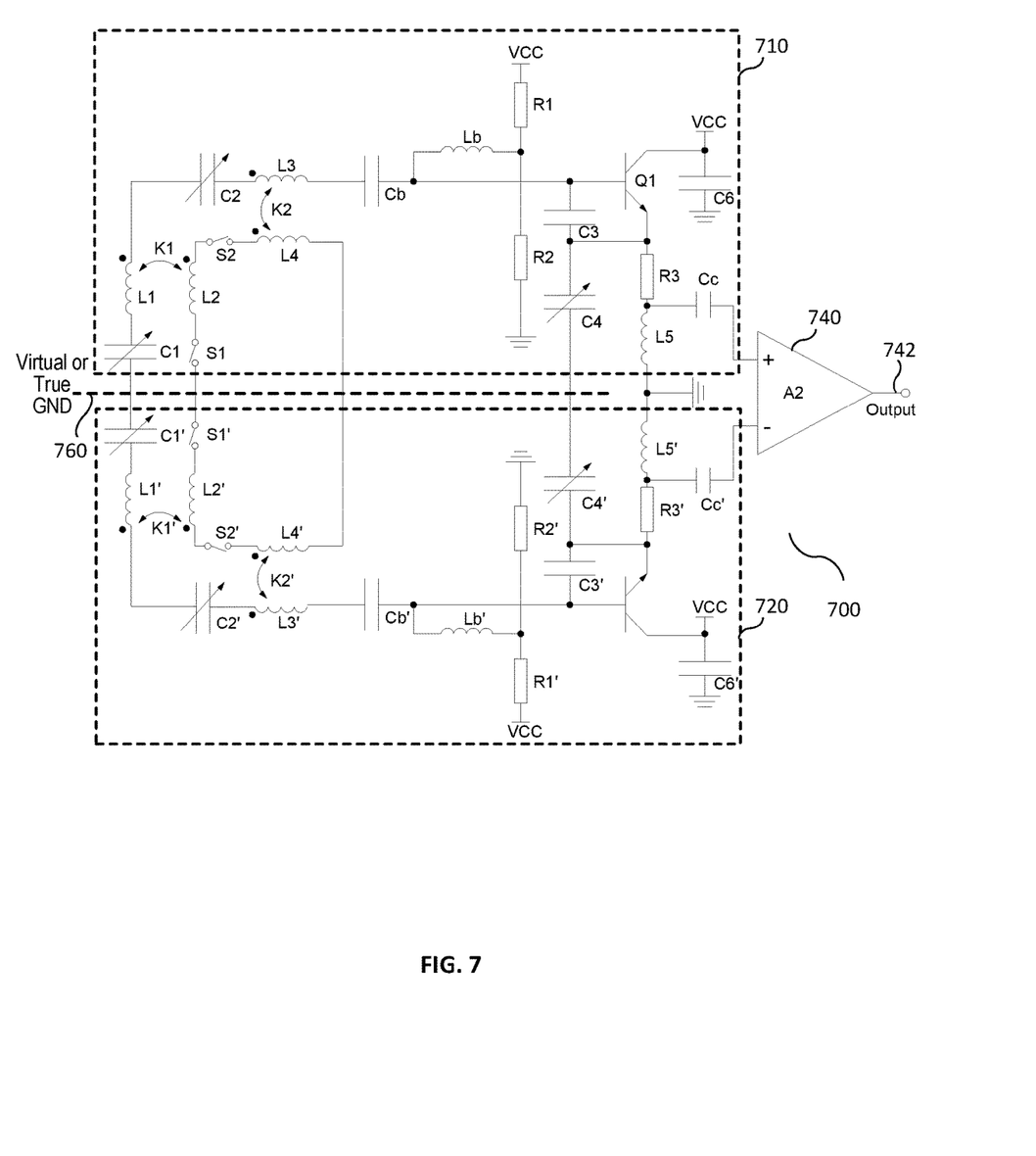
FIG. 7 is an alternative multi-band push-push VCO with multiple switches in secondary path according to a fourth embodiment of the invention.

FIG. 7 is an alternative multi-band push-push VCO 700 with multiple switches in secondary path according to embodiment 4 of the invention. Compared to the VCO 600 shown in FIG. 6, each single ended VCO 710 or 720 has multi-LC sections (e.g., L1-C1, L3-C2, L1'-C1', and L3'-C2') on primary path with one inductor in each LC sections coupled to a secondary path. For example, inductors L1, L1', L3 and L3' on primary path are coupled to L2, L2', L4 and L4' respectively. Capacitors C1, C2, C1' and C2' may each be a variable cap, a switch cap, or a switch cap in parallel with a variable cap. The push-push VCO 700 adopts a buffer amplifier 740 with differential input instead of a single-ended buffer amplifier to generate an amplified output 742. The push-push VCO 700 is also formed by having two single-ended VCO implemented in a balanced structure symmetric along a symmetric line 760, which may be a virtual ground or a true ground. Capacitors Cb/Cb', C3/C3' and C4/C4' may each be implemented with one or more fixed capacitors, one or more varactors, one or more switchable capacitors, or any combination thereof. Alternatively, the buffer amplifier 740 with differential input may be replaced by a doubler with differential input for doubling the output signal frequency band. Although the VCO 700 showing in FIG. 7 has an differential output signal (used as input of the amplifier 740) tapped out from symmetric connection points in the negative resistance circuit, one skilled in the art shall understand that differential output signal may also be tapped out from any pair of connection points on the coupled primary path, as long as the connection point pair is symmetric along the symmetric line, e.g. points pair a/a', b/b', c/c', d/d', etc.

Although FIG. 6 and FIG. 7 respectively shows an VCO output signal tapped out from a connection point along virtual GND and an VCO output signal differentially tapped out from connection points symmetrical along virtual GND, one skilled in the art shall understand that VCO output signals shown in FIG. 6 and FIG. 7 may be tapped from the same push-push VCO (e.g. the VCO 700) such that one push-push VCO may provide both a first VCO output signal (e.g. an output tapped out from connection point between C4 and C4' in FIG. 7, similar to the amplified output signal 642) with a frequency doubling the resonant frequency of the single-ended VCO and a second VCO output signal (e.g. amplified output signal 742) with a frequency same as the resonant frequency of the single-ended VCO. With such a configuration, a user may choose to use either the first VCO output signal, the second VCO output signal, or even both output signals, for enhanced functionality of one push-push VCO.

Embodiment 5

Figure 8:
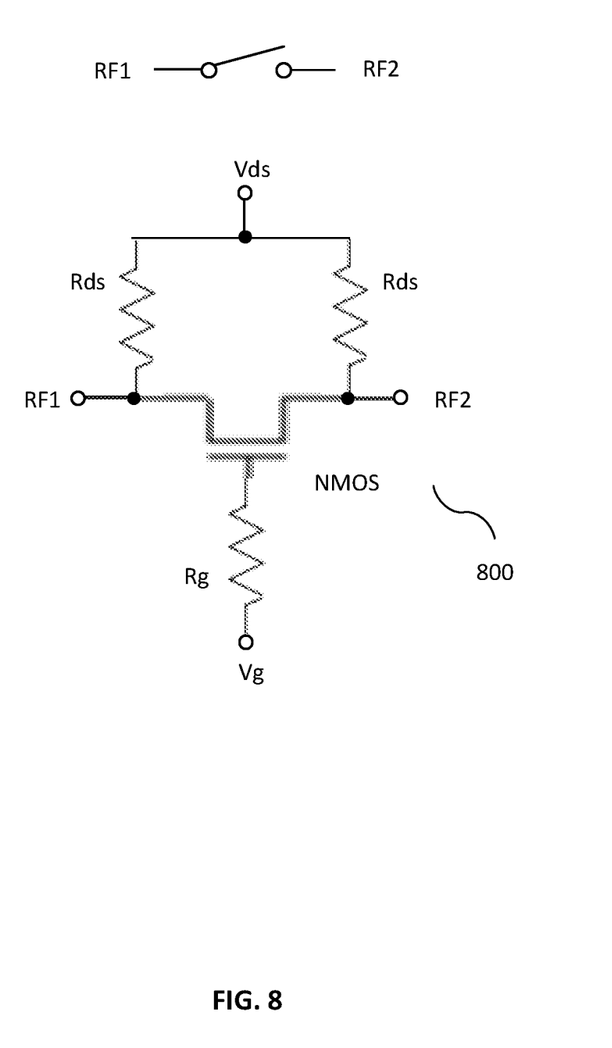
FIG. 8 is a circuit diagram of a switch in secondary path according to a fifth embodiment of the invention.

FIG. 8 is a circuit diagram of a switch 800 in secondary path according to embodiment 5 of the invention. The switch 800 may be a controllable semiconductor switch, such as an N-type metal-oxide-semiconductor (NMOS) switch having a gate (G), source (S) and drain (D). The source (S) and drain (D) respectively couple to RF1 port and RF2 port, which may be operatively connected or disconnected by controlling the Vg or Vds to create a voltage difference between Vg and Vds. Rds and Rg are biasing resistors that isolate the RF signals from leaking to the DC bias. Although the NMOS switch is shown in FIG. 8, one skilled in the art shall understand various other controllable switches, such as P-type metal-oxide-semiconductor (PMOS) switches, bipolar junction transistor (BJT) switches, high electron mobility transistor (HEMT) switches, micro-electromechanical (MEMS) switches, etc. may also be used for the secondary path. Such variations shall also be within the scope of this invention.

The foregoing description of the invention has been described for purposes of clarity and understanding. It is not intended to limit the invention to the precise form disclosed. Various modifications may be possible within the scope and equivalence of the appended claims.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

It shall also be noted that elements of the claims, below, may be arranged differently including having multiple dependencies, configurations, and combinations. For example, in embodiments, the subject matter of various claims may be combined with other claims.

The invention claimed is:

1. A coupled-inductor based resonator comprising:
   a primary path comprising multiple inductor-capacitor (LC) tuning stages, each tuning stage comprising an primary inductor and a capacitor;
   a DC blocking capacitor disposed on the primary path to block DC bias voltage from leaking into the resonator; and
   a secondary path comprising multiple secondary inductors and multiple controllable switches, at least one of the multiple secondary inductors is inductively coupled to one corresponding primary inductor, such that an equivalent inductor of the corresponding primary inductor is adjustable by switchably engaging the inductive coupling between the one of the multiple secondary inductors and the corresponding primary inductor.

2. The coupled-inductor based resonator of claim 1 wherein at least one LC tuning stage has an adjustable capacitor.

3. The coupled-inductor based resonator of claim 2, wherein the adjustable capacitor is a varactor or a back-to-back varactor pair.

4. The coupled-inductor based resonator of claim 1 wherein the multiple controllable switches are semiconductor switches controlled to switch ON or OFF simultaneously.

5. The coupled-inductor based resonator of claim 1 wherein the DC blocking capacitor is a fixed capacitor, an adjustable capacitor, a switchable capacitor, or a combination thereof.

6. The coupled-inductor based resonator of claim 4 wherein the multiple controllable switches are NMOS switches.

7. A voltage controlled oscillator (VCO) comprising:
   a coupled-inductor based resonator comprising:
      a primary path comprising at least one inductor-capacitor (LC) tuning stage, each tuning stage comprising an primary inductor and a capacitor; and
      a secondary path comprising multiple controllable switches and one or more secondary inductors, at least one secondary inductor is inductively coupled to a corresponding primary inductor, such that an equivalent inductor of the corresponding primary inductor is adjustable by switchably engaging the inductive coupling between corresponding primary inductor and secondary inductor; and
   a negative resistance circuit coupled to the primary path of the coupled-inductor based resonator to maintain oscillations in the coupled-inductor based resonator.

8. The VCO of claim 7, wherein the capacitor of each tuning stage is a fixed capacitor, a varactor, a switchable capacitor, or a combination thereof.

9. The VCO of claim 7 wherein the multiple controllable switches are semiconductor switches controlled to switch ON or OFF simultaneously.

10. A push-push voltage controlled oscillator (VCO) comprising:
    a pair of single-ended VCOs coupled in a balanced structure symmetric along a symmetric line, each single-ended VCO comprising:
       a primary path comprising one or more inductor-capacitor (LC) tuning stages, each tuning stage comprising an primary inductor and a capacitor; and
       a secondary path comprising one or more secondary inductors, at least one secondary inductor is inductively coupled to a corresponding primary inductor;
    wherein the primary path of each single-ended VCO couples together, the secondary path of each single-ended VCO couples to form a closed loop, the closed loop comprise at least one controllable switch, the equivalent inductor of the corresponding primary inductor of the primary path of each single-ended VCO is adjustable by switchably engaging the inductive coupling between the corresponding primary inductor and the one of the multiple secondary inductors.

11. The push-push VCO of claim 10 wherein the push-push VCO taps out a single-ended output signal from a connection point on the coupled primary paths, the connection point is on the symmetric line, the single-ended output signal has a frequency doubling a resonant frequency of the pair of single-ended VCOs.

12. The push-push VCO of claim 10 wherein the push-push VCO taps out a differential output signal from a pair of connection points on the coupled primary paths, the pair of connection points are symmetric along the symmetric line, the differential output signal has a frequency same as a resonant frequency of the pair of single-ended VCOs.

13. The push-push VCO of claim 10 wherein the closed loop in the secondary path has multiple controllable switches coupled in series and controlled to switch ON or OFF simultaneously.

14. The VCO of claim 7 further comprises a DC blocking capacitor coupled between the primary path and the negative resistance circuit to block DC bias voltage leaking from the negative resistance circuit into the resonator.

15. The VCO based resonator of claim 14 wherein the DC blocking capacitor is a fixed capacitor, an adjustable capacitor, or a combination thereof.

16. The VCO of claim 14 wherein the negative resistance circuit comprises an NPN transistor having a base coupled to the primary path of the coupled-inductor based resonator, a collector coupled to an external power supply, and an emitter.

17. The push-push VCO of claim 10 wherein the symmetric line is a virtue ground or a true ground.

18. The push-push VCO of claim 11 further comprises an amplifier coupled to receive the single-ended output signal to output a first amplified output signal.

19. The push-push VCO of claim 12 further comprises a differential amplifier to receive the differential output signal to output a second amplified output signal.

* * * * *